US008320586B2

(12) United States Patent
Shen

(10) Patent No.: US 8,320,586 B2
(45) Date of Patent: Nov. 27, 2012

(54) SYSTEM AND METHOD FOR REDUCING VOLUME SPIKE IN AN ELECTRONIC DEVICE

(75) Inventor: Yai-Nan Shen, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 775 days.

(21) Appl. No.: 12/541,383

(22) Filed: Aug. 14, 2009

(65) Prior Publication Data

US 2010/0104107 A1 Apr. 29, 2010

(30) Foreign Application Priority Data

Oct. 24, 2008 (CN) .......................... 2008 1 0305175

(51) Int. Cl.
*H03G 3/00* (2006.01)
*H02B 1/00* (2006.01)

(52) U.S. Cl. ........ 381/104; 381/105; 381/107; 381/123; 381/58; 381/74

(58) Field of Classification Search .................... 381/58, 381/59, 80, 81, 85, 104, 105, 107–109, 74, 381/94.5
See application file for complete search history.

(56) References Cited

U.S. PATENT DOCUMENTS

| | | | | |
|---|---|---|---|---|
| 6,148,085 | A * | 11/2000 | Jung | 381/104 |
| 6,359,987 | B1 * | 3/2002 | Tran et al. | 381/58 |
| 6,813,577 | B2 * | 11/2004 | Yoshino et al. | 702/111 |
| 7,315,625 | B2 * | 1/2008 | Iwasaki et al. | 381/104 |
| 7,532,732 | B2 * | 5/2009 | Denninghoff | 381/309 |
| 7,672,470 | B2 * | 3/2010 | Lee | 381/333 |
| 8,165,316 | B2 * | 4/2012 | Suzuki et al. | 381/80 |
| 8,165,320 | B2 * | 4/2012 | Lee | 381/104 |
| 2002/0039426 | A1 * | 4/2002 | Takemoto et al. | 381/104 |
| 2006/0247927 | A1 * | 11/2006 | Robbins et al. | 704/225 |

* cited by examiner

*Primary Examiner* — Xu Mei
(74) *Attorney, Agent, or Firm* — Altis Law Group, Inc.

(57) ABSTRACT

A system and method for reducing volume spike during switching of audio output devices of an electronic device is provided. The system and method adjusts a volume level of a first audio output device currently adopted by the electronic device for audible output to a muted level, and switches the audible output from the first audio output device to a second audio output device with the muted level. The system and method further receives a desired volume level input by a user, and adjusts the second audio output device from the muted level to the desired volume level.

20 Claims, 3 Drawing Sheets

SYSTEM AND METHOD FOR REDUCING VOLUME SPIKE IN AN ELECTRONIC DEVICE

BACKGROUND

1. Technical Field

Embodiments of the present disclosure are related to audio data processing systems and methods, and particularly to a system and method for reducing volume spike in an electronic device.

2. Description of Related Art

At present, electronic devices, such as mobile phones, computers, for example, may use different audio output devices, such as loudspeakers and headphones. Sometimes, when audible output switches from one audio device to another audio device, such as from a loudspeaker to a head phone, users may experience a volume spike, such as an unexpected volume level higher than the prior audio output device, which may cause discomfort.

DETAILED DESCRIPTION

All of the processes described may be embodied in, and fully automated via, functional code modules executed by one or more general purpose computers or processors. The code modules may be stored in any type of computer-readable medium or other storage device. Some or all of the methods may alternatively be embodied in specialized computer hardware or electronic apparatus.

Figure 1:
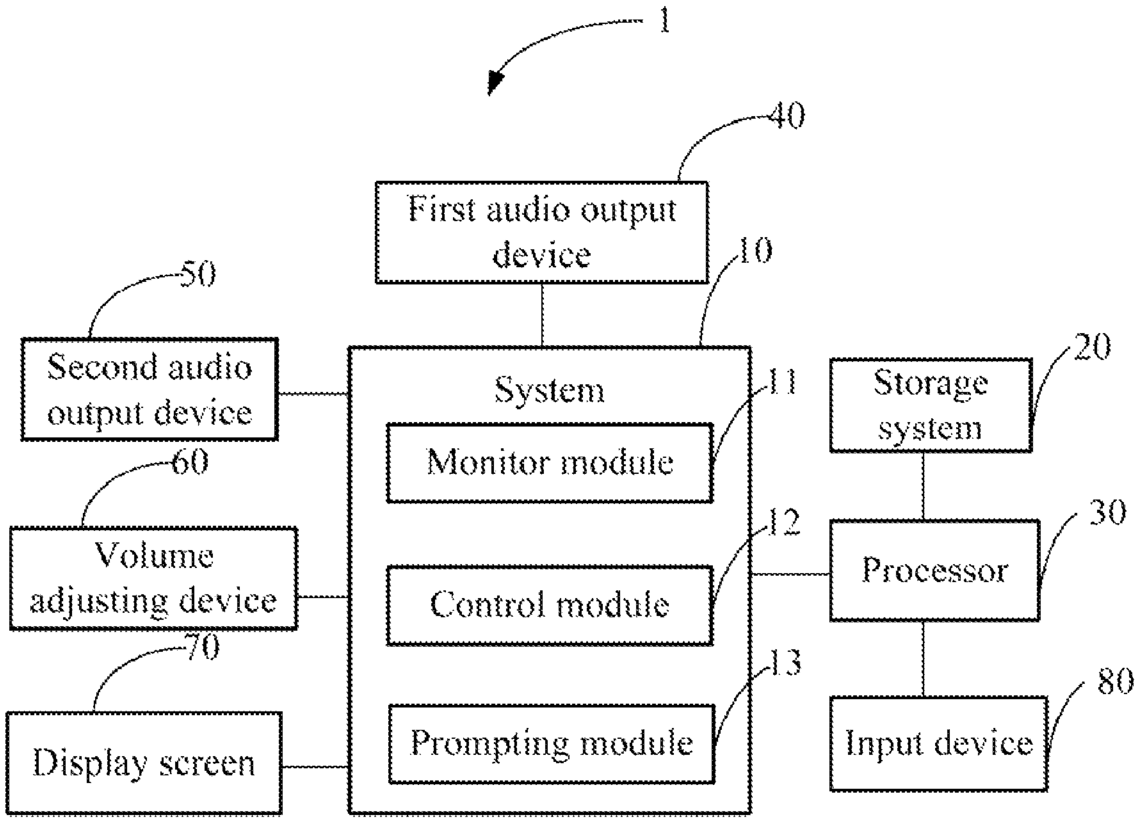
FIG. 1 is a block diagram of one embodiment of an electronic device comprising a system for reducing volume spike.

FIG. 1 is a block diagram of one embodiment of an electronic device 1 comprising a system 10 for reducing volume spike during switching of audio output devices of the electronic device 1. Before switching current audible output from an audio output device to any other audio output device of the electronic device 1, the system 10 adjusts a volume level of the audio output device to a muted level, so as to reduce audio during the switching process.

In one embodiment, the electronic device 1 may include a first audio output device 40 and a second audio output device 50. The electronic device 1 further includes a volume adjusting device 60, a display screen 70, and an input device 80. The input device 80 may include a keyboard and a touch screen. The electronic device 1 further includes a storage system 20 that stores one or more computerized codes of the system 10. A processor 30 of the electronic device 1 executes the one or more computerized codes of the system 10, to provide functions of the system 10 for reducing volume spike. Depending on the embodiment, the electronic device 1 may be a mobile phone, a computer, a personal digital assistant, or any other suitable electronic product having more than one audio output device. The storage system 20 may be an internal storage card or an external storage card, e.g., a smart media card, a secure digital card, a compact flash card, for example.

The system 10 includes a monitor module 11, a control module 12, and a prompting module 13. The monitor module 11 monitors a volume level of the first audio output device 40 currently adopted by the electronic device 1 for audible output. For example, the first audio output device 40 may be a speaker, and a current volume level of the speaker may be 120 decibels (dB). The monitor module 11 also detects if the electronic device 1 receives a switch signal operable to switch the audible output from the first audio output device 40 to the second audio output device 50, such as an earphone, for example.

The control module 12 automatically adjusts the volume level of the first audio output device 40 to a predetermined volume level, in response that the electronic device 1 receives the switch signal. For example, the control module 12 may automatically adjusts the volume level of the speaker from 120 dB to 0 dB (i.e., a muted level). Depending on the embodiment, switching between audio output devices can be realized via hardware or software interfaces of the electronic device 1. For example, a user may click an icon of the earphone displayed on the display screen 70 of the electronic device 1, so as to trigger the switch signal operable to switch the audible output from the speaker currently adopted by the electronic device 1 to the earphone. Alternatively, the user may connect a cable adapter of the earphone to an earphone socket on the electronic device 1, so as to trigger the switch signal.

After adjusting the volume level of the first audio output device 40 currently adopted by the electronic device 1 to the predetermined volume level, the control module 12 switches the audible output from the first audio output device 40 to the second audio output device 50 with the predetermined volume level. For example, after the volume of the speaker is 0 dB, the control module 12 switches the audible output from the speaker to the earphone with 0 dB.

Figure 3:
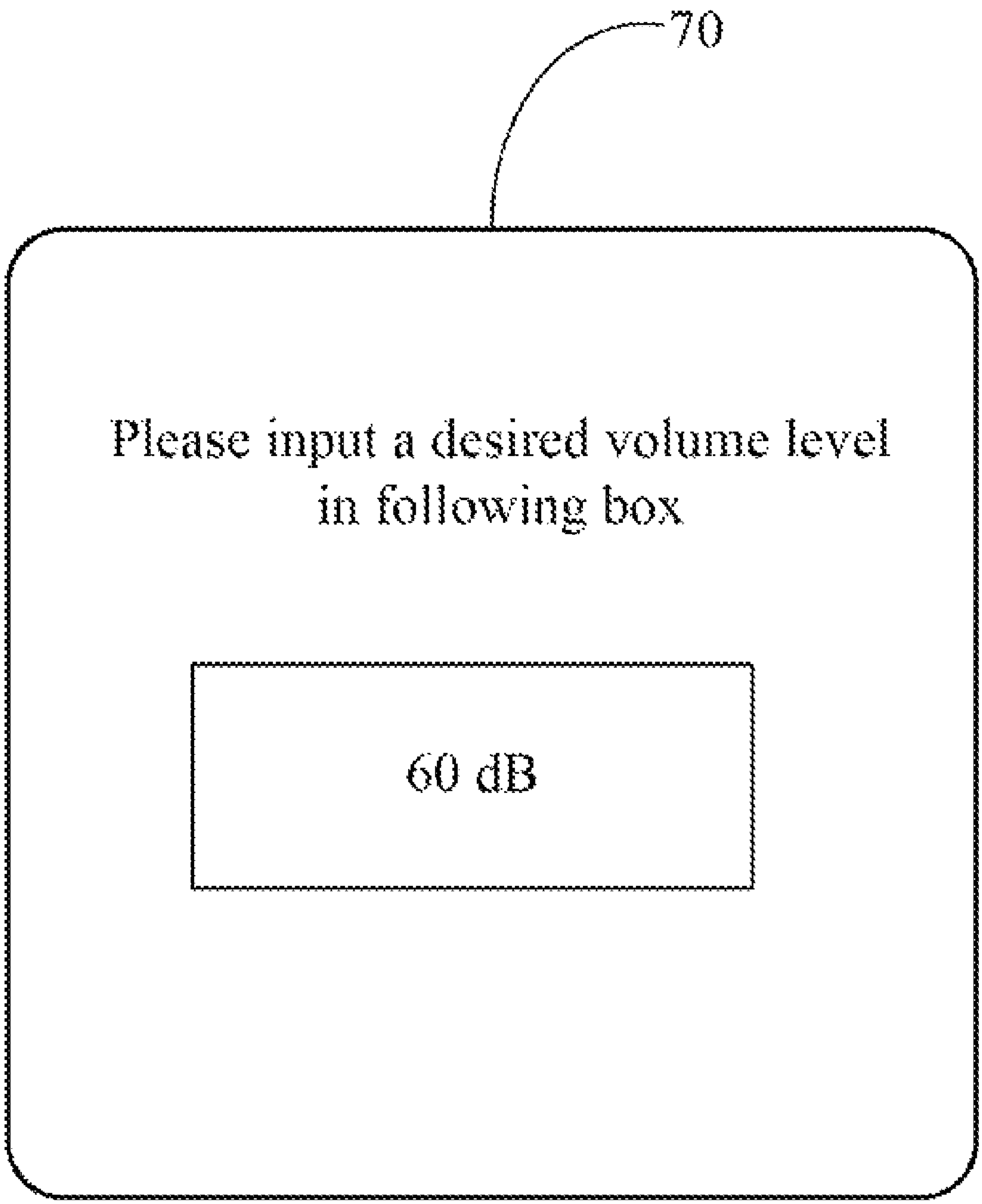
FIG. 3 illustrates a dialog box prompting a user to input a desired volume level.

The prompting module 13 may display a dialog box on the display screen 70 to prompt the user to input a desired volume level (as shown in FIG. 3). After the user inputs his/her desired volume level via the input device 80, the control module 12 automatically adjusts the second audio output device 50 from the predetermined volume level to the desired volume level. For example, the user may prefer 60 dB when using the earphone to listen to music, so the control module 12 automatically adjusts the earphone from 0 dB to 60 dB. Alternatively, the user may adjust the earphone from 0 dB to 60 dB by operating the volume adjusting device 60.

Figure 2:
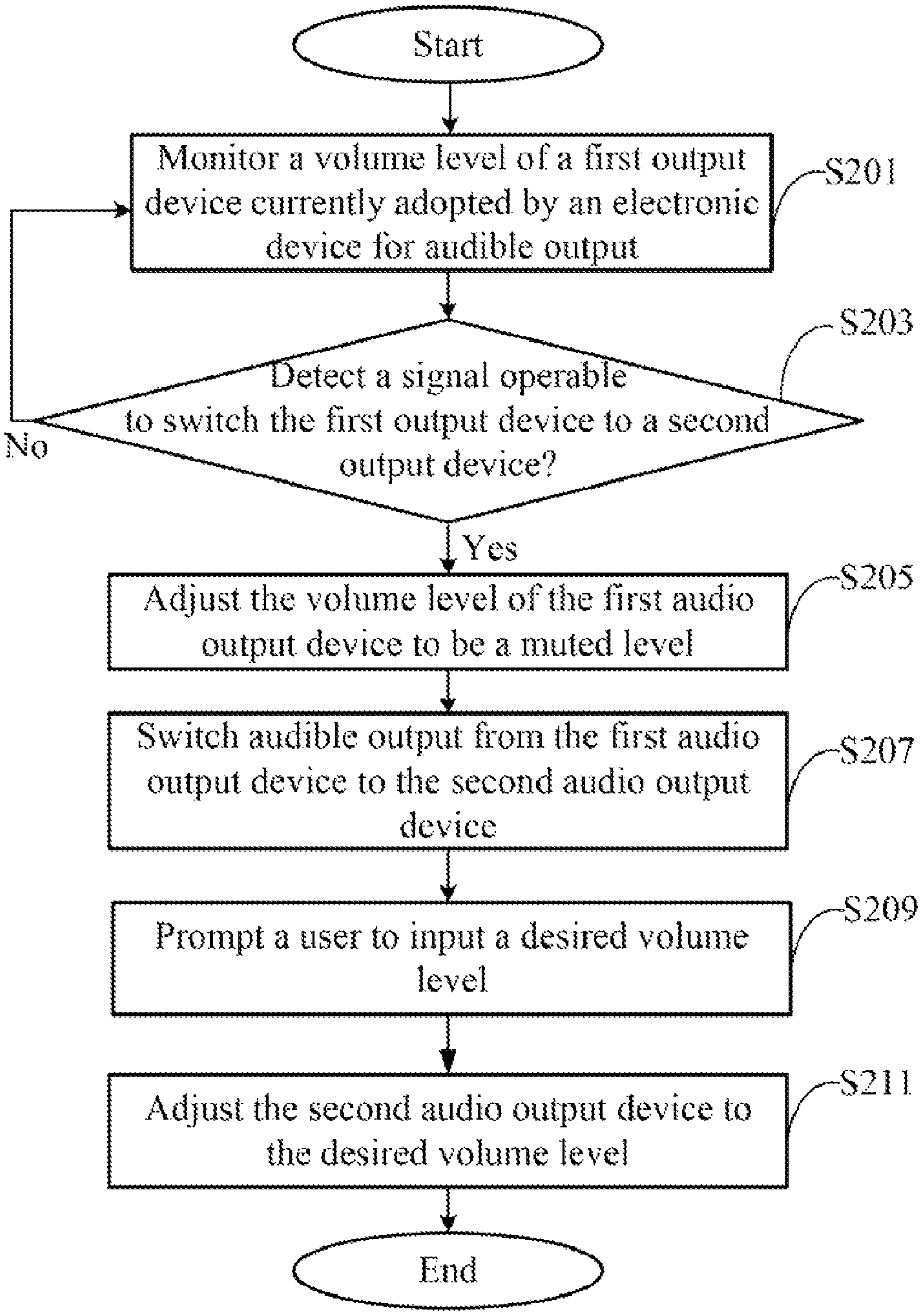
FIG. 2 is a flowchart of one embodiment of a method for reducing volume spike in the electronic device.

FIG. 2 is a flowchart of one embodiment of a method for reducing volume spike in the electronic device 1 of FIG. 1. Depending on the embodiment, additional blocks may be added, others removed, and the ordering of the blocks may be changed.

In block S201, the monitor module 11 monitors a volume level of the first audio output device 40 currently adopted for audible output by the electronic device 1. In one embodiment, the first audio output device 40 is a speaker, and a current volume level of the speaker is 120 dB.

In block S203, the monitor module 11 detects if the electronic device 1 receives a switch signal operable to switch the audible output from the first audio output device 40 to the second audio output device 50. In one embodiment, the second audio output device 50 is an earphone. If no switch signal is detected by the monitor module 11, the procedure returns to block S201. Otherwise, if the switch signal is detected by the monitor module 11, the procedure goes to block S205. It may be understood that, switching between audio output devices can be realized via hardware or software interfaces of the electronic device 1. For example, a user may click a icon of the earphone displayed on the display screen 70, so as to trigger the switch signal operable to switch the audible output from the speaker to the earphone. Alternatively, the user may connect a cable of the earphone to a earphone slot on the electronic device 1 to trigger the switch signal.

In block S205, the control module 12 automatically adjusts the volume level of the first audio output device 40 to a predetermined volume level, such as 0 dB (i.e., a muted level).

In block S207, the control module 12 switches the audible output from the first audio output device 40 to the second audio output device 50 with the predetermined volume level. For example, the control module 12 switches the audible output from the speaker to the earphone with 0 dB.

In block S209, the prompting module 13 displays a dialog box to prompt the user to input a desired volume level (as shown in FIG. 3). For example, the user may prefer 60 dB when using the earphone to listen to music, then the user may input 60 dB to the dialog box via the input device 80.

In block S211, the control module 12 automatically adjusts the second audio output device 50 from the predetermined volume level to the desired volume level. For example, the control module 12 automatically adjusts the earphone from 0 dB to 60 dB. Alternatively, the user may adjust the earphone from 0 dB to 60 dB by operating the volume adjusting device 60.

The above embodiments automatically adjusts a volume level of an audio output device to a muted level before switching current audible output from the audio output device to any other audio output device, therefore, audio spike is reduced during switching the audio output devices.

It should be emphasized that the above-described inventive embodiments are merely possible examples of implementations, and set forth for a clear understanding of the principles of the present disclosure. Many variations and modifications may be made to the above-described inventive embodiments without departing substantially from the spirit and principles of the present disclosure. All such modifications and variations are intended to be included herein within the scope of this disclosure and the above-described inventive embodiments, and the present disclosure is protected by the following claims.

What is claimed is:

1. An electronic device for reducing volume spike during switching of audio output devices of the electronic device, the electronic device comprising:
- a memory system;
- at least one processor; and
- one or more programs stored in the memory system to be executed by the at least one processor, the one or more programs comprising:
  - a monitor module to monitor a volume level of a first audio output device currently adopted for audible output by the electronic device, and detect a switch signal operable to switch the audible output from the first audio output device to a second audio output device; and
  - a control module to automatically adjust the volume level of the first audio output device to a predetermined volume level, and switch the audible output from the first audio output device to the second audio output device with the predetermined volume level.

2. The electronic device of claim 1, wherein the one or more programs further comprise a prompting module to receive a user-desired volume level of using the second audio output device, and the control module is further to automatically adjust the second audio output device from the predetermined volume level to the user-desired volume level, which is input by the user via an input device of the electronic device.

3. The electronic device of claim 2, wherein the input device is a keyboard or a touch screen.

4. The electronic device of claim 1, wherein the first audio output device is a speaker, and the second audio output device is an earphone.

5. The electronic device of claim 1, wherein the predetermined volume level is a muted level.

6. The electronic device of claim 1, wherein the electronic device is selected from the group consisting of a computer, a mobile phone, and a personal digital assistant.

7. The electronic device of claim 1, wherein the storage system is a smart media card, a secure digital card, or a compact flash card.

8. A computer-implemented method for reducing volume spike during switching of audio output devices of an electronic device, the method comprising:
- monitoring a volume level of a first audio output device currently adopted for audible output by the electronic device;
- detecting a switch signal operable to switch audible output from the first audio output device to a second audio output device;
- automatically adjusting the volume level of the first audio output device to a predetermined volume level; and
- switching the audible output from the first audio output device to the second audio output device with the predetermined volume level.

9. The method of claim 8, further comprising:
- receive a user-desired volume level of using the second audio output device, and
- automatically adjusting the second audio output device from the predetermined volume level to the user-desired volume level, which is input by the user via an input device of the electronic device.

10. The method of claim 9, wherein the input device is a keyboard or a touch screen.

11. The method of claim 8, wherein the first audio output device is a speaker, and the second audio output device is an earphone.

12. The method of claim 8, wherein the predetermined volume level is a muted level.

13. The method of claim 8, wherein the electronic device is selected from the group consisting of a computer, a mobile phone, and a personal digital assistant.

14. The method of claim 8, wherein the storage system is a smart media card, a secure digital card, or a compact flash card.

15. A non-transitory storage medium storing a set of instructions, the set of instructions being executed by a processor to perform a method for reducing volume spike during switching of audio output devices of an electronic device, the method comprising:
- monitoring a volume level of a first audio output device currently adopted for audible output by the electronic device;
- detecting a switch signal operable to switch the audible output from the first audio output device to a second audio output device;
- automatically adjusting the volume level of the first audio output device to a predetermined volume level; and
- switching the audible output from the first audio output device to the second audio output device with the predetermined volume level.

16. The non-transitory storage medium of claim 15, wherein the method further comprises:
- receive a user-desired volume level of using the second audio output device, and automatically adjusting the second audio output device from the predetermined volume level to the user-desired volume level, which is input by the user via an input device of the electronic device.

17. The non-transitory storage medium of claim 15, wherein the first audio output device is a speaker, and the second audio output device is an earphone.

18. The non-transitory storage medium of claim 15, wherein the predetermined volume level is a muted level.

19. The non-transitory storage medium of claim 15, wherein the electronic device is selected from the group consisting of a computer, a mobile phone, and a personal digital assistant.

20. The non-transitory storage medium of claim 15, wherein the storage medium is a smart media card, a secure digital card, or a compact flash card.

* * * * *